United States Patent (10) Patent No.: US 8,318,292 B2
Ohigashi                                    (45) Date of Patent:      Nov. 27, 2012

(54) RESIN SHEET WITH COPPER FOIL, MULTILAYER PRINTED WIRING BOARD, METHOD FOR MANUFACTURING MULTILAYER PRINTED WIRING BOARD AND SEMICONDUCTOR DEVICE

(75) Inventor: Noriyuki Ohigashi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/921,567

(22) PCT Filed: Mar. 19, 2009

(86) PCT No.: PCT/JP2009/001227
§ 371 (c)(1),
(2), (4) Date: Sep. 9, 2010

(87) PCT Pub. No.: WO2009/119046
PCT Pub. Date: Oct. 1, 2009

(65) Prior Publication Data
US 2011/0014453 A1      Jan. 20, 2011

(30) Foreign Application Priority Data
Mar. 26, 2008      (JP) ................. 2008-079841

(51) Int. Cl.
*B32B 3/00*      (2006.01)
(52) U.S. Cl. ............. 428/209; 428/297.4; 428/355 EP; 428/352; 174/258; 174/259
(58) Field of Classification Search ................. 428/209, 428/355 EP, 297.4, 352; 174/258, 259
See application file for complete search history.

(56) References Cited

U.S. PATENT DOCUMENTS

| | | | |
|---|---|---|---|
| 5,605,781 A | | 2/1997 | Gelorme et al. |
| 5,686,172 A | * | 11/1997 | Ohya et al. ................. 156/89.28 |
| 6,124,023 A | * | 9/2000 | Furuta et al. ................. 428/172 |
| 6,197,407 B1 | * | 3/2001 | Andou et al. ................. 428/209 |
| 6,224,965 B1 | * | 5/2001 | Haas et al. ................. 428/209 |
| 6,459,046 B1 | * | 10/2002 | Ochi et al. ................. 174/256 |
| 6,562,179 B1 | * | 5/2003 | Ikeguchi et al. ............ 156/307.5 |
| 6,691,409 B2 | * | 2/2004 | Suzuki et al. ................. 29/852 |
| 7,473,458 B2 | * | 1/2009 | Takai et al. ................. 428/209 |

(Continued)

FOREIGN PATENT DOCUMENTS
JP       07-224252        8/1995
(Continued)

OTHER PUBLICATIONS
International Search Report for International Application No. PCT/JP2009/001227, Jun. 30, 2009.

*Primary Examiner* — Cathy Lam
(74) *Attorney, Agent, or Firm* — Ditthavong Mori & Steiner, P.C.

(57) ABSTRACT

A resin sheet with a copper foil, comprising: a carrier layer; a copper foil layer having a thickness 0.5 to 5 μm provided over the carrier layer; and an insulating resin layer formed over the copper foil layer, wherein the insulating resin layer is once abutted with base material, and then the carrier layer is delaminated from the copper foil layer, and wherein the insulating resin layer contains a cyanate ester resin having phenolic novolac backbone and a polyfunctional epoxy resin.

15 Claims, 2 Drawing Sheets

U.S. PATENT DOCUMENTS

2009/0068454 A1 3/2009 Murakami et al.
2009/0117388 A1 5/2009 Nakanishi et al.

FOREIGN PATENT DOCUMENTS

| | | |
|---|---|---|
| JP | 08-018239 | 1/1996 |
| JP | 2000-169672 | 6/2000 |
| JP | 2001-181375 | 7/2001 |
| JP | 2002-241590 | 8/2002 |
| JP | 2002-299834 | 10/2002 |
| JP | 2002-348469 | 12/2002 |
| JP | 2004-071749 | 3/2004 |
| JP | 2004-146711 | 5/2004 |
| JP | 2005-248147 | 9/2005 |
| JP | 2005-285540 | 10/2005 |
| JP | 2006-274218 | 10/2006 |
| JP | 2006-321229 | 11/2006 |
| JP | 2007-043184 | 2/2007 |
| WO | WO 2007/046316 | 4/2007 |

* cited by examiner

RESIN SHEET WITH COPPER FOIL, MULTILAYER PRINTED WIRING BOARD, METHOD FOR MANUFACTURING MULTILAYER PRINTED WIRING BOARD AND SEMICONDUCTOR DEVICE

TECHNICAL FIELD

The present invention relates to a resin sheet with a copper foil, a multilayer printed wiring board, a method for manufacturing a multilayer printed wiring board, and a semiconductor device.

BACKGROUND ART

In recent years, increased requirements for faster transmission, increasing miniaturization and increasing weight reduction of electronic equipments promote increasing high-density integration of printed boards. Therefore, build-up processes for stacking interconnects while mutually coupling only inter-layer sections of the printed board via inner via holes are frequently adopted. Among these, processes employing resin sheets with copper foils (Patent Documents 1 and 2) and build-up processes according to semi-additive processes (Patent Documents 3, 4 and 5) are adopted.

[Patent Document 1] Japanese Patent Laid-Open No. H 7-224,252 (1995)
[Patent Document 2] Japanese Patent Laid-Open No. 2002-299,834
[Patent Document 3] Japanese Patent Laid-Open No. 2001-181,375
[Patent Document 4] Japanese Patent Laid-Open No. 2002-241,590
[Patent Document 5] Japanese Patent Laid-Open No. 2005-285,540

DISCLOSURE OF THE INVENTION

The semi-additive process involves forming a via hole in a surface of an insulating resin layer with a laser beam or the like, and then removing smear from an inner via hole by a plasma-processing or a chemical processing, and conducting a non-electrolytic copper plating process. Since palladium (Pd) serving as a catalyst for the non-electrolytic plating process is adhered over the entire surface of the resin in such process, it is difficult to enhance the insulating reliability between the microinterconnect circuits. Besides, a rough treatment of the resin surface by a chemical processing is difficult to be controlled, and thus such treatment involves poor versatility, since suitable selection of a chemical solution and investigations on suitable process conditions are required. Further, the micro rough treatment conducted for high frequency applications may cause a difficulty in providing improved adhesiveness between the resin and the metallic layer. On the other hand, even if the resin sheet with the copper foil is employed, a copper foil having a thickness of 9 to 18 μm should be employed in the present situation in consideration for adhesiveness of the resin layer with the copper foil, and thus a manufacture of a microinterconnect circuit is constrained. On the other hand, if an extremely thinner copper foil of a thickness of equal to or smaller than 5 μm is employed for the manufacture of a microcircuit, a problem of a reduced adhesiveness with the insulating resin layer is caused. In particular, heat treatment processes such as a reflow process and the like are conducted in the installation operation, and in such case, a problem is caused in adhesiveness between the extremely thinner copper foil and the insulating resin layer after the reflow process or the like.

The present inventions is to provide a resin sheet with a copper foil with enhanced adhesiveness between the insulating resin layer and the copper foil layer, and to provide a multilayer printed wiring board employing such resin sheet with the copper foil, a method for manufacturing a multilayer printed wiring board, and a semiconductor device.

According to one aspect of the present invention, there is provided a resin sheet with a copper foil, comprising: a carrier layer; a copper foil layer having a thickness 0.5 to 5 μm provided over the carrier layer; and an insulating resin layer formed over the copper foil layer, wherein the insulating resin layer is once abutted with base material, and then the carrier layer is delaminated from the copper foil layer, and wherein the insulating resin layer contains a cyanate ester resin having phenolic novolac backbone and a polyfunctional epoxy resin. According to the above-described configuration, enhanced adhesiveness of the insulating resin layer with the copper foil layer having a thickness of 0.5 to 5 μm can be achieved. Having such configuration, enhanced adhesiveness of the copper circuit layer with the insulating resin layer can be achieved, even if a thermal processing such as reflow process and the like is conducted after a circuit is formed by employing the resin sheet with the copper foil.

According to another aspect of the present invention, there is provided a method for manufacturing a multilayer printed wiring board employing the resin sheet with the copper foil as described above, including: stacking the resin sheet with the copper foil over the base material so that the insulating resin layer of the resin sheet with the copper foil is abutted with the surface of the base material having a circuit pattern formed thereon; delaminating the carrier layer from the resin sheet with the copper foil; and creating a hole in the copper foil layer and the insulating resin layer with a laser beam. According to further aspect of the present invention, there is provided a printed board which is manufactured by the method for manufacturing the multilayer printed wiring board as described above, and a semiconductor device, formed by installing a semiconductor element in the printed board as described above.

According to the present invention, a resin sheet with a copper foil with improved adhesiveness between the insulating resin layer and the copper foil layer can be provided, and a multilayer printed wiring board employing such resin sheet with the copper foil, method for manufacturing the multilayer printed wiring board and a semiconductor device can be provided.

BRIEF DESCRIPTION OF THE DRAWINGS

These and other objects, features and advantages of the present invention will become more apparent from the following descriptions on the preferred embodiments, taken in conjunction with the annexed drawings wherein.

BEST MODE FOR CARRYING OUT THE INVENTION

Figure 1:
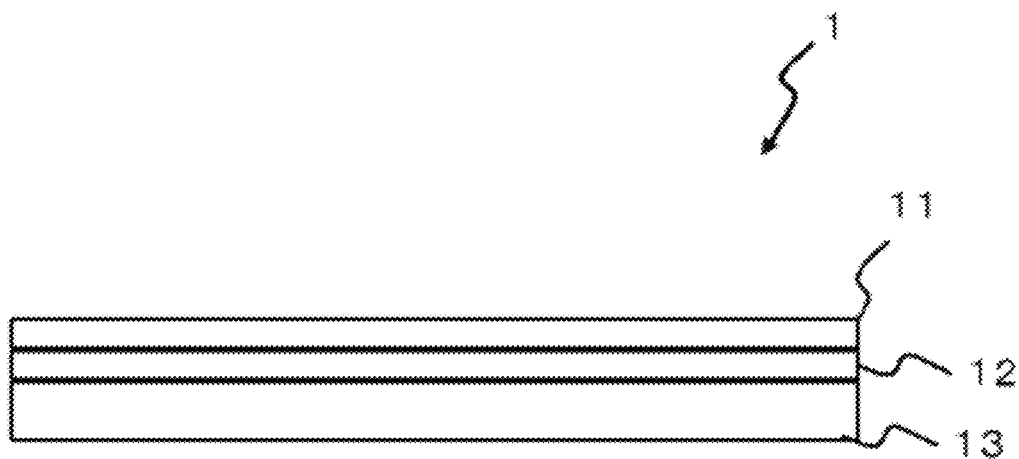
FIG. 1 is a schematic diagram, illustrating a resin sheet with a copper foil according to an embodiment of the present invention.

Preferable embodiments of the present invention will be described on the basis of the drawings as follows. In the beginning, general outlines of a resin sheet 1 with a copper foil will be described in reference to FIGS. 1 and 2. The resin sheet 1 with the copper foil includes a carrier layer 1, a copper foil layer 12 of a thickness of 0.5 to 5 μm provided on the carrier layer 1, and an insulating resin layer 13 formed on the copper foil layer 12. Such resin sheet 1 with the copper foil is designed, in which once the base material 2 is abutted with the insulating resin layer 13, and then the carrier layer 1 is delaminated from copper foil layer 12. The insulating resin layer 13 contains a cyanate ester resin having phenolic novolac backbone and a polyfunctional epoxy resin.

In the next, the resin sheet 1 with the copper foil will be fully described. The carrier layer 1 is a material that is delaminatable from the copper foil layer 12 as described above. Typical materials for such carrier layer 1 include, for example, a copper foil, an aluminum foil, a nickel foil, a copper alloy foil, a stainless steel foil, and a plated composite metal foil. Among these, in particular, the copper foil is preferably employed for the carrier layer, since the copper foil is easily recycled after the delamination. The thickness of such carrier layer may be preferably 5 to 100 μm. The thickness of equal to or larger than 5 μm allows providing improved handling ability. The thickness of equal to or smaller than 100 μm also allows inhibiting the increase in the manufacturing cost. Further, the term "delaminatable" means the condition, in which the carrier layer 11 can be delaminated from the copper foil layer 12 after it is subjected to the condition employed in the manufacture of the multilayer printed wiring board, namely at a temperature 80 to 260 degrees C. and a pressure 0.1 to 5 MPa. Therefore, a junction interface layer may be provided between the carrier layer 11 and the copper foil layer 12.

The type of the above-described junction interface layer is not particularly limited, as long as it provides a suitable adhesion of the copper foil layer 12 with the carrier layer 11 with an adhesive strength, which does not easily cause a delamination. For example, metals such as chromium, lead, silver, zinc, and nickel and the like; oxides of these metals; sulfides such as sodium sulfide, ammonium sulfide, copper sulfide and the like; chromate; and the like, may typically be employed for an inorganic junction interface layer. Further, nitrides; sulfur compounds; organic silicon compounds; and carboxylic acids; and the like, may typically be employed for an organic based junction interface layer.

The copper foil layer 12 may be generally manufactured by, for example, a known electrolytic process, and may be obtained by controlling a rate of precipitation of particles or the like. Further, the copper foil layer 12 having the substantial thickness of 0.5 to 5.0 μm by a gravimetric method may be employed. The thickness of the copper foil layer 12 of equal to or smaller than 5 μm allows providing improved processability for forming fine circuits. The thickness of the copper foil layer 12 of equal to or larger than 0.5 μm also allows preventing an unwanted delamination thereof together with the carrier layer 11. Further, the thickness of the copper foil layer 12 of equal to or larger than 0.5 μm allows inhibiting a formation of an unwanted line, thereby preventing a short circuit in the case of forming a copper circuit. Further, the use of the electrolytic copper foil layer for the copper foil layer 12 provides a formation of ultra fine protruding and contracting sections in the surface, providing enhanced adhesiveness with the insulating resin layer 13.

The resin composition composing the insulating resin layer contains a cyanate ester resin having phenolic novolac backbone and a polyfunctional epoxy resin. This allows providing lower thermal expansion and enhanced adhesiveness between the insulating resin layer and the copper foil layer. The above-described polyfunctional epoxy resin has three or more epoxy groups in its molecule. Such polyfunctional epoxy resin may be preferably a halogen free resin. The above-described polyfunctional epoxy resin may typically includes, for example: novolac epoxy resins such as phenolic novolac epoxy resin, creosol novolac epoxy resin and the like; epoxy resins such as biphenyl epoxy resin, biphenyl aralkyl epoxy resin, aryl alkylene epoxy resin, naphthalene epoxy resin, anthracene epoxy resin, phenoxy epoxy resin, dicyclopenta diene epoxy resin, norbornene epoxy resin, adamantane epoxy resin, fluorene epoxy resin and the like; or the like. In order to improve fire retardancy, biphenyl aralkyl epoxy resin, aryl alkylene epoxy resin, naphthalene epoxy resin, anthracene epoxy resin, phenoxy epoxy resin or the like may be preferably employed. Besides, in order to improve a thermal resistance of moisture-absorbed solder, epoxy resins such as dicyclopenta diene epoxy resin, norbornene epoxy resin, adamantane epoxy resin, fluorene epoxy resin or the like may be preferably employed. Among these, phenolic novolac epoxy resin and biphenyl aralkyl epoxy resin may be preferable, in view of providing improved compatibility with cyanate ester resins, improved fire retardancy, and improved reflow soldering resistance under a moisture absorption. One of these epoxy resins may be employed alone, or a combination of two or more of these epoxy resins may also be employed, though it is not particularly limited.

The content of the above-described polyfunctional epoxy resin is not particularly limited to any specific content, and may be preferably 10 to 85% wt. of the resin composition exclusive of the filler, and in particular, may be more preferably 30 to 70% wt. thereof. The content of equal to or higher than 10% wt. allows providing improved adhesiveness and improved mechanical strength of the insulating resin layer 13. The content of equal to or lower than 85% wt. ensures the sufficient heat resistance. In addition to above, the epoxy resin may preferably have a weight average molecular weight (Mw) of equal to or lower than $1.5 \times 10^3$. The use of such epoxy resin allows providing enhanced heat resistance and enhanced resistance to thermal decomposition, and further, providing improved film-forming ability in the manufacture of the resin sheet with the copper foil and improved adhesiveness with the internal layer circuit board in the manufacture of the multilayer printed wiring board. Further, the epoxy resin (A) employed in the present invention may preferably have a weight average molecular weight of equal to or lower than $1.0 \times 10^3$ and equal to or higher than $2.0 \times 10^2$, in view of providing improved moldability. Further, the epoxy resin may have number of repeating unit n of less than 10, and preferably equal to or less than 6.

The cyanate ester resin having phenolic novolac backbone is represented by, for example, the following chemical formula. Here, coordination of cyanato group in benzene ring is arbitrary, and is not limited to the structure shown in formula (I).

[formula 1]

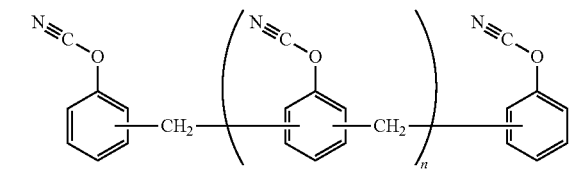

FORMULA [1]

n is an arbitrary integer number.

The phenolic novolac cyanate ester resins exhibit improved fire retardancy and reduced thermal expansion. Further, in addition to the phenolic novolac cyanate ester resin, one of, or two or more of, other type of cyanate ester resin(s) may be added. Other type of cyanate ester resins typically include a cyanate ester resin, which is obtained by a reaction of creosol novolac polyatomic phenols and halogen cyanide.

The content of the above-described cyanate ester resin is not particularly limited, and may be preferably 10 to 60% wt. of the resin composition exclusive of the filler, and in particular, may be more preferably 20 to 50% wt. thereof. The content of equal to or higher than 10% wt. ensures lower thermal expansion, and the content of equal to or lower than 60% wt. ensures sufficient mechanical strength of the insulating resin layer 13.

The above-described resin composition may preferably further contain an inorganic filler. The use of an inorganic filler achieves further lower thermal expansion. The type of the inorganic filler employed here is not particularly limited to any specific type, and may includes, for example: silicates such as talc, baked clay, unbaked clay, mica, glass and the like; oxides such as titanium oxide, alumina, silica, fused silica and the like; carbonates such as calcium carbonate, magnesium carbonate, hydrotalcite and the like; metalhydroxides such as aluminum hydroxide, magnesium hydroxide, calcium hydroxide and the like; sulfates or sulfites such as barium sulfate, calcium sulfate, calcium sulfite and the like; borates such as zinc borate, barium metaborate, aluminum borate, calcium borate, sodium borate and the like; nitrides such as aluminum nitride, boron nitride, silicon nitride, carbon nitride and the like; titanates such as strontium titanate, barium titanate and the like; or the like. One of these fillers may be employed alone, or a combination of two or more of these fillers may be employed. Among these, in particular, the silica is preferable, in view of providing lower thermal expansion and enhanced insulating reliability, and spherical fused silica is more preferable.

The above-described spherical fused silica exhibits enhanced fluidity in the molding process. The spherical silica may be subjected to a surface treatment, and is not particularly limited to any specific configuration. When the surface treatment is adopted, it is preferable to suitably select a surface treatment agent, which does not adversely affect a fluidity of the resin composition, and on the contrary the fluidity may be further improved by the use of such surface treatment. The surface treatment agent may be selected from a group consisting of silanes having functional group, cyclic organo siloxanes, organo halosilanes and alkyl silazanes, and one of these may be employed alone, or a combination of two or more of these may also be employed, though it is not particularly limited. Further, the spherical silica may preferably have a mean particle diameter D50 of equal to or larger than 0.3 µm, and equal to or smaller than 2.0 µm. In particular, it is preferable be equal to or larger than 0.5 µm and equal to or smaller than 1.5 µm. The use of the spherical silica having such particle size provides enhanced processability with a laser beam in the case of manufacturing a multilayer printed wiring board as will be discussed later. In this case, the mean particle diameter may be measured by a laser diffraction scattering method. The spherical silica is dispersed in the water by utilizing ultrasonic wave, and the particle size distribution of the spherical silica is presented in the volumetric basis by employing a laser diffraction particle size distribution analyzer (commercially available from HORIBA Co. Ltd., under the trade name of LA-500), and the mean particle diameter may be determined as the median diameter thereof to obtain the measurement. More specifically, the mean particle diameter of the spherical silica is defined by D50.

Further, for the above-described inorganic filler, an inorganic filler having a monodispersion mean particle diameter may be employed, or an inorganic filler having polydispersion mean particle diameter may be employed. Further, one of or two or more of inorganic filler(s) having a monodispersion mean particle diameter and/or an inorganic filler(s) having polydispersion mean particle diameter may be employed, though it is not particularly limited.

The content of the above-described inorganic filler is not particularly limited, and it is preferable to contain 20 to 250 parts by weight thereof over 100 parts by weight of the resin composition exclusive of the inorganic filler. More preferably, the content of 50 to 150 parts by weight allows exhibiting effects of lower thermal expansion, improved moldability and lower water absorption.

The above-described resin composition may preferably further contain a phenolic resin as the curing agent. This allows accelerating the cure of the cyanate ester resin and also serving as a curing agent for the epoxy resin, so that the glass transition temperature of the cured product can be increased. In addition, the presence of the phenolic resin provides enhanced mechanical strength of the insulating resin layer. Known phenolic resins may be employed, and for example, polyphenolic resins such as phenolic novolac, creosol novolac, phenol-modified polybutadiene, phenol aralkyl resins, addition products of phenols with dicyclopenta diene, and tris (hydroxyphenyl) alkanes and the like, though it is not particularly limited.

The available content of the above-described phenolic resin may range from a catalyst quantity for accelerating the cure of the cyanate ester resin to a quantity for exhibiting the effect as the curing agent for the epoxy resin. Therefore, a ratio of the phenolic hydroxyl equivalent of the phenolic resin and the epoxy equivalent of the epoxy resin may be preferably within a range of from 0.05:1 to 1:1. In order to exhibit sufficient catalytic action of the phenolic hydroxyl group, the ratio may be preferably within a range of from 0.05:1 to 0.2:1, and more preferably within a range of from 0.075:1 to 0.15:1. In addition, if it requires the phenolic hydroxyl group of the phenolic resin functioning as the curing agent of the epoxy resin, ratio of the phenolic hydroxyl equivalent of the phenolic resin and the epoxy equivalent of the epoxy resin may be preferably within a range of from 0.4:1 to 1:1, and more preferably within a range of from 0.7:1 to 1:1. The content of lower than the above-described lower limit may lead to a reduced catalytic action, and the content exceeding the above-described upper limit may lead to a reduced mechanical strength, or increased water absorption, which may cause a deteriorated moisture proof reliability.

In addition, the above-described resin composition may preferably further contain a thermoplastic resin. This allows providing improved mechanical strength of the obtained insulating resin layer, improved adhesiveness with the electrolytic copper foil layer, and improved moisture proof reliability.

The above-described thermoplastic resin typically includes: thermoplastic resins such as polyimide resin, polyamide imide resin, phenoxy resin, polyphenylene oxide resin, polyethersulfone resin, polyester resin, polyethylene resin, polystyrene resin and the like; polystyrene based thermoplastic elastomers such as styrene-butadiene copolymer, styrene-isoprene copolymer and the like; thermoplastic elastomers such as polyolefin based thermoplastic elastomer, polyamide based elastomer, polyester based elastomer and the like; diene based elastomers such as polybutadiene, epoxy-modified polybutadiene, acrylic-modified polybutadiene, and methacrylic-modified polybutadiene and the like, though the present invention is not particularly limited thereto. Each of these resins may be employed alone, or two or more types thereof having different weight-average molecular weights may be employed, or one, two or more of types thereof may be employed together with a prepolymer thereof. Among these, phenoxy resin is preferable. This allows providing improved thermal resistance and improved mechanical strength.

The phenoxy resin here indicates the phenoxy resin having a weight-average molecular weight (Mw) of $5.0 \times 10^3$ or higher. Phenoxy resin may have number of repeating unit of preferably 10 or larger, and more preferably 15 or larger, and further preferably 30 or larger. The type of the above-described phenoxy resin is not particularly limited, and includes, for example: phenoxy resins having bisphenol backbone such as phenoxy resin having bisphenol A backbone, phenoxy resin having bisphenol F backbone, phenoxy resin having bisphenol S backbone, phenoxy resin having bisphenol M (4,4'-(1,3-phenylene diisopropylidene) bisphenol) backbone, phenoxy resin having bisphenol P (4,4'-(1,4-phenylene diisopropylidene) bisphenol) backbone, phenoxy resin having bisphenol Z (4,4'-cyclohexylidene bisphenol) backbone and the like; phenoxy resin having a bisphenol AP (4,4'-(1-phenyl ethylidene) bisphenol) backbone; phenoxy resin having novolac backbone; phenoxy resin having anthracene backbone; phenoxy resin having fluorene backbone; phenoxy resin having dicyclopenta diene backbone; phenoxy resin having norbornene backbone; phenoxy resin having naphthalene backbone; phenoxy resin having biphenyl backbone; phenoxy resin having adamantane backbone and the like. In addition, a phenoxy resin configured of having multiple types of the above-described backbones may be employed, or a phenoxy resin having multiple types of the above-described backbones with different rates may be employed. Further, a combination of multiple types of phenoxy resins having different backbones may be employed, or a combination of multiple types of phenoxy resins having different weight-average molecular weights may be employed, or prepolymers thereof may be additionally employed. The weight-average molecular weight (Mw) of the available phenoxy resin may be $5.0 \times 10^3$ to $2.5 \times 10^5$, and preferably $8.0 \times 10^3$ to $1.0 \times 10^5$. Further preferably, the range may be $1.0 \times 10^4$ to $6.0 \times 10^4$. The molecular weights within such ranges provide enhanced compatibility with other resins and improved moldability.

It is preferable that the above-described resin composition may also further contain polyacrylic ester. This allows depositing the above-described resin composition uniformly on the copper foil layer 12. This inhibits a generation of a defect such as an eye hole or a surface irregularity, thereby providing an improved adhesiveness of the insulating resin layer 13 with the copper foil layer 12. The polyacrylic ester here indicates a polymer obtained by the following acrylic ester (monomer), or a copolymer obtained by the following two or more types of the following monomers. Typical acrylic ester (monomer) includes: ethyl acrylate, butyl acrylate, isopropyl acrylate, 2-ethylhexyl acrylate, isobutyl acrylate, tert-butyl acrylate, sec-butyl acrylate, cyclohexyl acrylate, octadecyl acrylate, 2-ethoxyethyl acrylate, lauryl acrylate, stearyl acrylate, methyl methacrylate, ethyl methacrylate, isopropyl methacrylate, butyl methacrylate, sec-butyl methacrylate, tert-butyl methacrylate, cyclohexyl methacrylate, octadecyl methacrylate, 2-ethylhexyl methacrylate, lauryl methacrylate, stearyl methacrylate and the like. This allows controlled wettability between the copper foil layer 12 and the insulating resin layer 13. In addition, among these, polymers of (meth) acrylic esters (molecular weight Mw: $1.0 \times 10^3$ to $1.0 \times 10^5$) are preferable, and further, polymers of alkyl (meth) acrylic esters (molecular weight Mw: $3.0 \times 10^3$ to $1.5 \times 10^4$) that carbon number of alkyl group is 3 to 10, are more preferable. For example, polybutyl acrylate is preferable. The content of the polyacrylic ester may be preferably 0.1 to 10.0% wt. of the resin composition exclusive of the filler, more preferably 0.3 to 5.0% wt., and particularly preferably 0.5 to 2% wt. The content of the polyacrylic ester of 10% wt. or lower provides a prevention for a segregation polyacrylic ester over the surface of the insulating resin layer to ensure preventing the failure of the adhesion. On the other hand, the content of the polyacrylic ester of 0.1% wt. or higher provides a prevention for a defect in the coating film for forming the insulating resin layer such as an eye hole or an unevenness, and this allows quickly eliminating fine bubbles from the varnish. In addition, the content of 0.1% wt. or higher allows ensuring uniform thickness of the insulating resin layer 13.

A cure accelerator may be employed for the above-described resin composition, as required. The type of the above-described cure accelerator is not particularly limited, and typically include, for example: imidazole compounds; organometallic salts such as zinc naphthenate, cobalt naphthenate, stannous octoate, cobalt octoate, bis acetylacetonato cobalt (II), tris acetylacetonato cobalt (III) and the like; tertiary amines such as triethyl amine, tributyl amine, diazabicyclo [2,2,2]octane and the like; phenolic compounds such as phenol, bisphenol A, nonylphenol and the like; organic acids such as acetic acid, benzoic acid, salicylic acid, paratoluene sulfonic acid and the like; and the like, or a mixture thereof. One of these compounds and derivatives thereof may be employed alone, or combination of two or more of these compounds and derivatives thereof may be employed.

Among the above-described cure accelerators, imidazole compound is particularly preferable. This allows providing improved storage stability of the above-described resin compositions and improved thermal resistance of moisture-absorbed solder in the case of forming the insulating resin layer. The above-described imidazole compound may be preferably selected to have sufficient solubility or sufficient dispersibility for an organic solvent with the above-described epoxy resin.

The use of such imidazole compound in the above-described resin composition allows effectively accelerating the reaction of the epoxy resin, and also allows providing equivalent characteristics with reduced blending ratio of the imidazole compound. Further, the resin composition employing such imidazole compound can be cured from a fine matrix unit in relation with the resin component with higher uniformity. This allows providing enhanced insulating performance and enhanced thermal resistance of the insulating resin layer formed in the multilayer printed wiring board.

The above-described imidazole compound employed for the resin composition of the present invention typically includes, for example, 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, 2-phenyl-4,5-dihydroxymethylimidazole, 2-phenyl-4-methyl-5-hydroxymethylimidazole and the like.

Among these, the imidazole compound selected from 1-benzyl-2-methylimidazole, 1-benzyl-2-phenylimidazole and 2-ethyl-4-methyl imidazole is preferable. Particularly improved compatibility of these imidazole compounds allows the cured product thereof having higher uniformity and having fine and uniform rough-treated surface, so that fine copper circuit can be easily formed and enhanced thermal resistance can be provided for the multilayer printed wiring board.

The content of the above-described imidazole compound is not particularly limited to any specific content, and 0.01 to 5.00% wt. over the whole resin composition exclusive of the above-described filler is preferable, and in particular 0.05 to 3.00% wt. is more preferable. This allows providing particularly improved thermal resistance.

It is preferable to further employ a coupling agent for the above-described resin composition. The type of the above-described coupling agent is not particularly limited, and typically includes silane-based, titanate-based, and aluminum-based coupling agents or the like. For example: aminosilane compounds such as N-phenyl-3-aminopropyltrimethoxysilane, 3-aminopropyltrimethoxysilane, 3-aminopropyltriethoxysilane, 3-(2-aminoethyl)aminopropyltrimethoxysilane, 3-(2-aminoethyl)aminopropyl triethoxysilane, 3-anilinopropyl trimethoxysilane, 3-anilinopropyl triethoxysilane, N-β-(N-vinylbenzylaminoethyl)-3-aminopropyltrimethoxysilane and N-β-(N-vinylbenzylaminoethyl)-3-aminopropyl triethoxysilane and the like; epoxysilane compounds such as 3-glycidoxypropyltrimethoxysilane, 3-glycidoxy propyl triethoxysilane and 2-(3,4-epoxycyclohexyl)ethyl trimethoxysilane and the like; and others silanes such as 3-mercaptopropyl trimethoxysilane, 3-mercaptopropyl triethoxysilane, 3-ureidopropyl trimethoxysilane, 3-ureidopropyl triethoxysilane, and 3-methacryloxy propyl trimethoxysilane and the like may be employed. One of these compounds may be employed alone, or a combination of two or more of these compounds may be employed. The use of such coupling agent allows providing improved wettability in the interface of the inorganic filler with the above-described epoxy resin and the cyanate ester resin. This provides improved thermal resistance, and in particular improved thermal resistance of moisture-absorbed solder.

The content of the above-described coupling agent is not particularly limited to any specific content, and may preferably be 0.05 to 5.00 parts by weight over 100 parts by weight of the inorganic filler. In particular, the content of 0.01 to 2.50 parts by weight is more preferable. The content of coupling agent of lower than the above-described lower limit may lead to insufficient effect for coating the inorganic filler to improve the thermal resistance. On the other hand, the content exceeding the above-described upper limit may lead to reduced flexural strength of the insulating resin layer. The content of the coupling agent within the above-described ranges allows providing enhanced balance of these characteristics.

In addition, for the purpose of improving various characteristics such as compatibility, stability, workability of the resin and the like, the above-described resin composition may suitably contain various types of additives of, for example, leveling agents, antifoaming agents, pigments, dyes, defoaming agents, ion trapping agents, non-reactive diluents, reactive diluents, thioxotropy-enhancing agents, thickening agents and the like.

The above-described resin composition may preferably further contain a fiberglass cloth. This allows providing further lower thermal expansion, and improved mechanical strength and improved dimensional stability.

Known fiberglass cloths that are employed for various types of printed boards may be employed. Typical materials for the fiberglass cloth include E glass, D glass, S glass, T glass and NE glass, and the types of the fiber include yarn and roving and the like, and the forms include woven cloth and nonwoven fabric, though it is not particularly limited. The above-described insulating resin layer may be effectively removed when a removal of smear is conducted by employing an oxidizing agent of, for example, permanganate, dichromate or the like.

The above-described resin sheet 1 with the copper foil may have the following characteristics by suitably adjusting the composition of the insulating resin layer 13. A rate of change (B/A×100) of a 90-degree peel strength (conducted with peel strength B) for the adhesiveness between the copper foil layer 12 and the insulating resin layer 13 that has been treated with the following treatments (1) to (5) after the carrier layer 11 is delaminated from the copper foil layer 12 (referred to as "peel strength B") over a 90-degree peel strength for the adhesiveness between the copper foil layer 12 and the insulating resin layer 13 that has been treated with only the following treatment (1) after the carrier layer 11 is delaminated from the copper foil layer 12 (referred to as "peel strength A") is equal to or higher than 50% and equal to or lower than 150%.

treatment (1):
the resin sheet with the copper foil is cured at 200 degrees C. for 60 minutes;
treatment (2)
the cured sheet is left for 192 hours within an atmosphere at a temperature of 30 degrees C. and a humidity of 60%;
treatment (3):
after the treatment (2), the sheet is heated at 260 degrees C. to 262 degrees C. for 5 to 10 seconds;
treatment (4):
after the treatment (3), the sheet is cooled to 30 degrees C.; and
treatment (5)
the treatment (3) and the treatment (4) are additionally repeated for two cycles
(the treatment (3) and the treatment (4) are repeated for three times in total).

Figure 3:
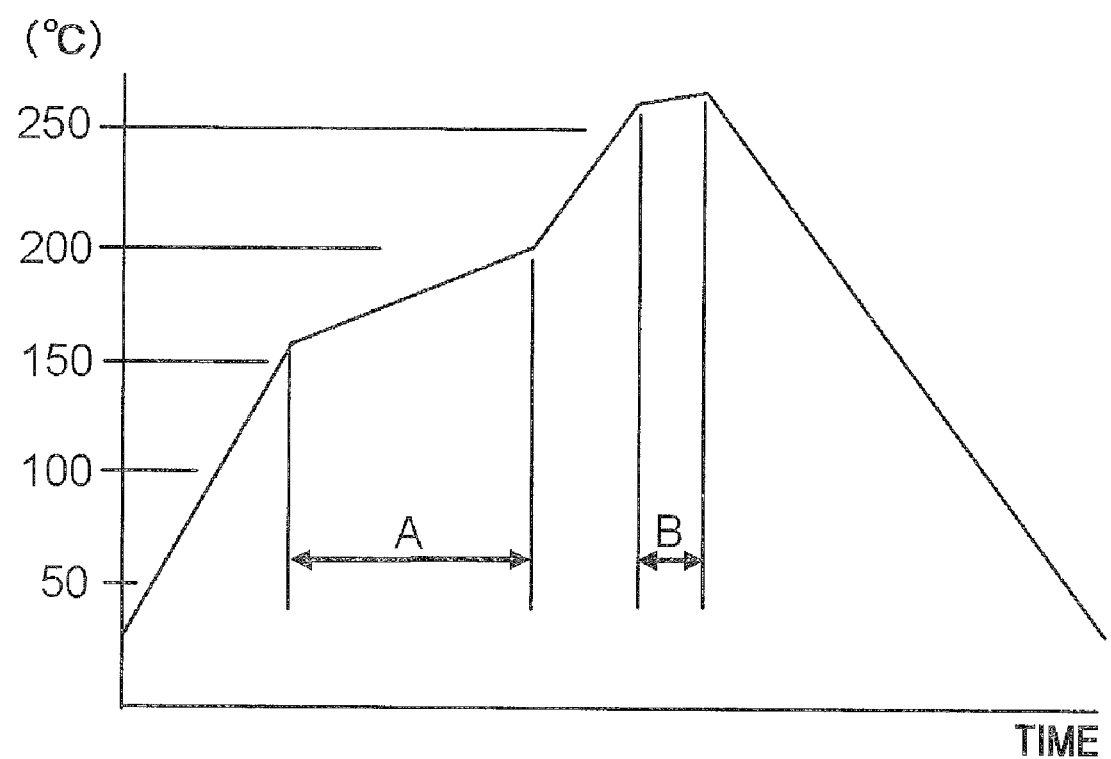
FIG. 3 is a graph, illustrating a temperature profile.

In addition to above, the specific description on the treatment (3) to the treatment (4) may provide a heat flow shown in FIG. 3. After the treatment (2) is finished, the temperature of the copper foil layer 12 and the insulating resin layer 13 is gradually elevated from room temperature (25 degrees C.) to 160 degrees C. (in 50 to 60 seconds). Next, the temperature is also elevated from 160 degrees C. to 200 degrees C. in 50 to 60 seconds (preheating, A in FIG. 3). Then, the temperature is also elevated from 200 degrees C. to 260 degrees C. in 65 to 75 seconds, and further the layers are heated at a temperature of 260 to 262 degrees C. for 5 to 10 seconds (reflow, B in FIG. 3). The temperature in the reflow process may be within a range of from 260 to 262 degrees C. Then, a cooling is carried out to 30 degrees C. for 15 minutes (radiational cooling). Once the treatment (5) is finished, then an electrolytic copper plating is conducted so as to achieve the thickness of the copper foil layer 12 as 25 μm. This is because the precise measurement of the 90-degree peel strength requires a certain thickness of the copper foil. On the other hand, 90-degree peel strength for the adhesion between the insulating resin layer 13 processed by the treatment (1) and the copper foil layer 12 is measured as follows. First of all, once the treatment (1) is finished, then an electrolytic copper plating is conducted so as to achieve the thickness of the copper foil layer 12 as 25 μm. Then, the 90-degree peel strength between the insulating resin layer 13 and the copper foil layer 12 is measured.

Since the resin sheet 1 with the copper foil having such characteristics exhibits higher adhesiveness between the copper foil layer 12 and the insulating resin layer 13, the multilayer printed wiring board with enhanced reliability can be manufactured.

In addition, the above-described resin sheet 1 with the copper foil may also have the following characteristics by suitably adjusting the composition of the insulating resin layer 13. The insulating resin layer 13 processed by a thermal processing at 200 degrees C. for 60 minutes exhibits an average thermal expansion rate expanding toward a direction along the surface of the insulation resin layer at temperatures ranging from 25 degrees C. to 150 degrees C. of equal to or lower than 40 ppm/degree C.

Since the resin sheet 1 with the copper foil having such characteristic exhibits lower thermal expansion coefficient of the insulating resin layer after the cure process of equal to or lower than 40 ppm/degree C. over the condition before the cure process, the multilayer printed wiring board with enhanced reliability can be manufactured.

Next, the process for manufacturing the resin sheet with the copper foil of the present invention will be described. First of all, the above-described resin composition is dissolved, mixed and stirred in an organic solvent such as acetone, methylethyl ketone, methylisobutyl ketone, toluene, ethyl acetate, cyclohexane, heptane, cyclohexane, cyclohexanone, tetrahydrofuran, dimethylformamide, dimethylacetamide, dimethylsulfoxide, ethylene glycol, cellosolve based solvent, carbitol based solvent, anisole and the like, by selecting various types of mixers such as ultrasonic dispersion system, high pressure collision dispersion system, high speed rotating dispersion system, beads mill system, high speed shearing dispersion system, and autorotation revolution dispersion system and the like, to produce the resin varnish.

The content of the resin composition in the above-described resin varnish is not particularly limited to any specific content, and may be preferably 45 to 85% wt., and in particular, may be more preferably 55 to 75% wt. This allows providing the resin varnish having preferable viscosity for forming the insulating resin layer on the peelable-type copper foil.

In the next, the above-described resin varnish is applied over a copper foil layer with a carrier layer by selecting various types of coating devices, and then is dried. Alternatively, the resin varnish is spray-applied over the copper foil with a spray equipment, and then is dried. The resin sheet with the copper foil can be manufactured by these methods. The above-described coating device is not particularly limited, and for example, a roll coater, a bar coater, a knife coater, a gravure coater, a die coater, a comma coater and a curtain coater or the like may be employed. Among these, the processes employing a die coater, a knife coater and a comma coater are preferable. This allows the manufacture of the resin sheet with the copper foil having uniform thickness of the insulating resin layer with improved efficiency without creating a void.

When a prepreg composed of a base material such as a fiberglass cloth or the like dipped with the above-described resin varnish is employed, the resin sheet with the copper foil may be obtained by, for example, disposing the prepreg between the electrolytic copper foil layer (mat surface) and the cover film, and then processing at a temperature of equal to or higher than the melting point of the resin constituting the prepreg.

The insulating resin layer of the resin sheet with the copper foil of the present invention exhibits improved filling capability for circuit steps, and improved flatness after the filling, and improved laser processability.

The thickness of the insulating resin layer of the above-described resin sheet with the copper foil is not particularly limited, and is preferably within a range of 1 to 60 μm, and in particular, is more preferably within a range of 5 to 40 μm. The thickness of the insulating resin layer of equal to or larger than the above-described lower limit is preferable in view of providing improved insulation reliability, and the thickness of equal to or smaller than the above-described upper limit is preferable in view of achieving reduced film thickness, which is one of the general object in the multiple-layered interconnect board. This allows manufacturing the multilayer printed wiring board by molding while filling the irregularity of the internal layer circuit, and ensuring preferable thickness of the insulating resin layer. Here, the insulating resin layer 11 of the resin sheet with the copper foil manufactured as described above may not be a completely cured product, and for example, may be a partially cured product (B stage).

Figure 2:
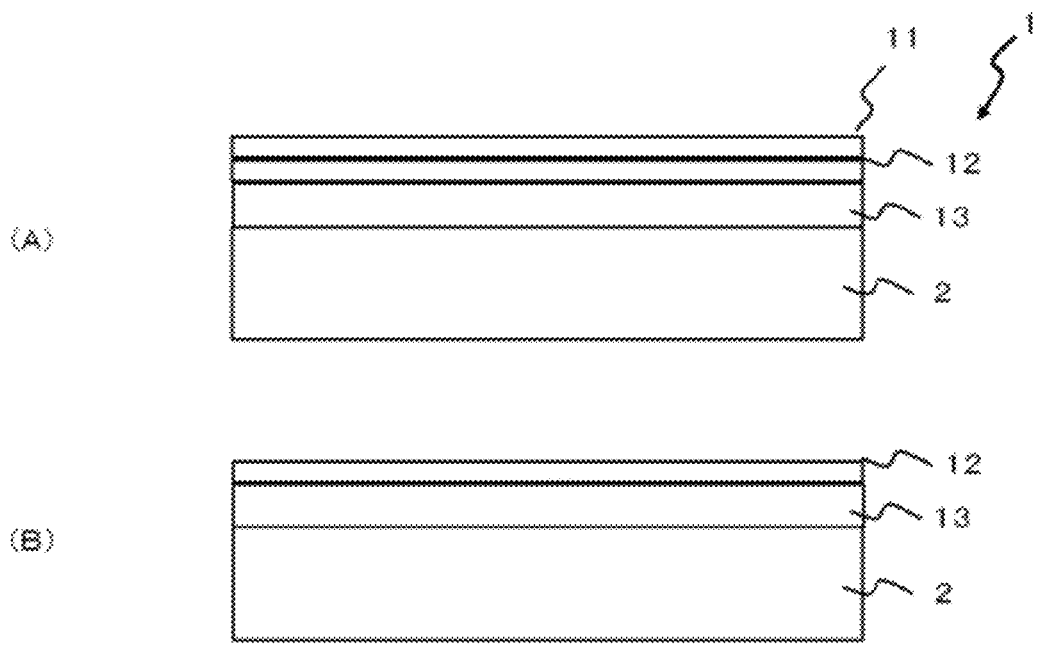
FIG. 2 is a schematic diagram, illustrating the condition which deposits a base member the resin sheet with the copper foil.

The resin sheet with the copper foil manufactured as described above may be employed to manufacture the multilayer printed wiring board. In the beginning, as shown in FIG. 2 (A), a base material (internal layer circuit base material) 2 is prepared. Next, the resin sheet 1 with the copper foil is stacked on the base material 2 so that the insulating resin layer 13 of the resin sheet 1 with the copper foil abuts with the surface of the base material 2 to form a stacked-layer member. Next, the above-described stacked-layer member is heated at 180 degrees C. for 60 minutes to cure the insulating resin layer 13. Then, as shown in FIG. 2 (B), the carrier layer 11 of the resin sheet 1 with the copper foil is delaminated. Then, a rough treatment is conducted for the copper foil layer 12 of the resin sheet 1 with the copper foil. The rough treatment may include a process of conducting a blackening treatment for the copper foil layer 12 to form a cuprous oxide film, or a process of etching the surface of the copper foil with sulfuric acid and hydrogen peroxide water to form a copper grain boundary coating film. Then, a hole is formed in the copper foil layer 12 and the insulating resin layer 13 with a laser beam (for example, carbon dioxide gas laser). Thereafter, the inside of the hole is plated, and further, the copper foil layer 12 is etched to shape a circuit geometry. The multilayer printed wiring board can be obtained by the above-described operations. Then, a semiconductor element having a solder bump as a junction is installed on such multilayer printed wiring board, and then a reflow process is conducted to obtain a semiconductor device.

The resin sheet with the copper foil, the multilayer printed wiring board and the semiconductor device according to the present invention will be described below, in reference to examples and comparative examples, though the present invention is not limited thereto.

Example 1

1. Manufacture of the Resin Sheet with the Copper Foil 45 parts by weight (26.2% wt.) of an epoxy resin (commercially available from Nippon Kayaku under the trade name of EOCN-1020-75; epoxy equivalent: 200); 45 parts by weight (26.2% wt.) of a cyanate ester resin (phenolic novolac cyanate ester, P130); 70 parts by weight (40.8% wt.) of an inorganic filler of spherical silica having a mean particle diameter of 0.5 μm (commercially available from Admatechs Company Limited under the trade name of SO-25H); 10 parts by weight (5.9% wt.) of a thermoplastic resin of a phenoxy resin (commercially available from JER under the trade name of YX8100, molecular weight of 30,000); 1 part by weight (0.6% wt.) of a polyacrylic ester (commercially available from BYK-Chemie under the trade name of BYK-350); and 0.5 part by weight (0.3% wt.) of a cure accelerator (commercially available from Shikoku Chemicals Corporation under the trade name of 1B2PZ), were mixed and dissolved in methylethyl ketone. Then, a high-speed stirring device was employed to stir thereof for 60 minutes to prepare a resin varnish containing 70% wt. of the solid content.

The electrolytic copper foil layer of the copper foil composed of the delaminatable carrier layer sticked with the electrolytic copper foil layer (commercially available from Mitsui Mining & Smelting Co. Ltd., under the trade name of MicroThin Ex-3, the carrier layer: copper foil (18 µm) and electrolytic copper foil layer (3 µm)) was coated with the resin varnish thus obtained by employing a comma coater. The coating process was carried out so as to have the thickness of the resin layer after the dehydration of 40 µm. Then, the resin layer was dried in a dryer at 150 degrees C. for ten minutes to manufacture the resin sheet with the copper foil. In addition to above, the mean particle diameter of the spherical silica was measured as follows. Such measurement was similarly carried out in other examples and comparative examples. The spherical silica was dispersed in the water by utilizing ultrasonic wave, and the particle size distribution of the spherical silica was prepared in the volumetric basis by employing a laser diffraction particle size distribution analyzer (commercially available from HORIBA Co. Ltd., under the trade name of LA-500), and the mean particle diameter may be determined as the median diameter thereof to obtain the measurement. More specifically, the mean particle diameter of the spherical silica is defined by D50.

Next, the multilayer printed wiring board manufactured by using the resin sheet with the copper foil obtained in the operation 1. will be described.

2. Formation of the Internal Layer Circuit and the Insulating Resin Layer

A double-sided copper clad laminate having a total thickness of 0.2 mm and a copper layer thickness of 12 µm (commercially available from Sumitomo Bakelite Co. Ltd. under the trade name of ELC-4785 GS) was employed, and a hole was opened with a drill machine, and then an electroless plating process was carried out to provide electrical conduction between the copper foil of the top side and the copper foil of the bottom side. Then, the copper foil of the top side and the copper foil of the bottom side were etched to form the internal layer circuit. In next, a rough treatment was conducted for the internal layer circuit (commercially available from Mec Company Ltd., under the trade name of CZ-8101) to from an irregularity in the surface. Next, the resin sheet with the copper foil obtained in the operation of 1. was stacked over the internal layer circuit by employing the vacuum lamination device. Next, the insulating resin layer was cured by heating at a temperature of 180 degrees C. for a duration time of 60 minutes, and then the carrier layer was delaminated. Here, the conditions for stacking the resin sheet with the copper foil were a temperature of 100 degrees C., a pressure of 1 MPa, and a duration time of 30 seconds. The stacked-layer member including the internal layer circuit and the resin sheet with the copper foil was obtained by the above described procedure.

3. Laser Processing and Formation of an Outer Layer Circuit

Next, a blackening process was conducted over the electrolytic copper foil layer in the surface, and then a carbon dioxide gas laser was utilized to form a via hole of φ 60 µm for providing an interlayer coupling. The blackening process was conducted according to the following conditions. A chemical solution containing 5 to 6 g/L of sodium chlorite ($NaClO_2$) and 9 to 12 g/L of sodium hydroxide (NaOH), and water for the rest of the solution, was employed. The temperature of the chemical solution was set to 85 degrees C., and the stacked-layer member containing the internal layer circuit and the resin sheet with the copper foil were dipped in such chemical solution for 5 minutes. Then, the stacked-layer member was dipped in a swelling solution (commercially available from Atotech Japan Co. Ltd., under the trade name of Swelling Dip Securiganth P) at 70 degrees C. for five minutes, and further was dipped in a potassium permanganate aqueous solution of 80 degrees C. for 15 minutes, and then was neutralized to carry out a desmear treatment in the inside of the via hole. Next, the surface of the electrolytic copper foil layer was etched to about 1 µm by a flash etching process, and then an electroless copper plating was conducted to a thickness of 1.0 µm. Then, a resist layer for an electrolytic copper plating process was formed to a thickness of 19 µm, and an exposure process was conducted depending on a circuit pattern to remove unexposed portions. Next, portions of the copper plating section without being coated with the resist layer were etched to form a circuit pattern. Further, an electrolytic copper plating was conducted to increase the thickness of the circuit pattern. Then, a post cure was conducted by heating at a temperature of 200 degrees for a duration time of 60 minutes to cure the insulating resin layer. Subsequently, the resist layer was delaminated, and a flash etching process was conducted over the entire surface to form a pattern having a dimension of circuit height of 20 µm and L/S=20/20 µm. Besides, in addition to the L/S=20/20 µm pattern, an alternative pattern having a dimension of circuit height of 10 µm and L/S=10/10 µm was also manufactured. Finally, a solder resist (commercially available from Taiyo Ink Mfg. Co. Ltd, under the trade name of PSR4000/AUS308) was formed over the surface of the circuit to a thickness of 20 µm, and the exposure/development processed were conducted for exposing a section of an electrode for coupling for the purpose of the installation of the semiconductor element, and then the solder resist was cured by heating at 150 degrees for 60 minutes to obtain the multilayer printed wiring board. In addition to above, nickel plating or gold plating process may be conducted for the exposed portions in the section for the electrode for coupling, as required.

The following evaluations were conducted on the resin sheet with the copper foil of Example 1, and the results are shown in table 1.

(1) Thermal Expansion Coefficient

A resin composition, which was manufactured by laminating two pieces of the resin surface of the resin sheet with the copper foil obtained in the above-described operation of 1., and subsequently heating with a drying-machine in a nitrogen atmosphere at 200 degrees C. for 1 hour to carry out the cure, was utilized as a sample specimen. In addition to above, such sample specimen was prepared by removing the copper foil layer and the carrier layer. A thermo-mechanical measurement device (commercially available from TA Instrument) was employed to carry out two cycles of measurements within a nitrogen atmosphere under the conditions of a tensile mode, by temperature ramp rate of 10 degrees C./min., at a temperature ranging from 25 to 300 degrees C., and with a load of 5 g. The average linear thermal expansion coefficient obtained in the second cycle for the temperature of 25 to 150 degrees C. (average linear thermal expansion coefficient toward the direction along the surface of the insulating resin layer) was determined as representing the linear thermal expansion coefficient.

(2) Surface Roughness

The surface roughness (Ra) was measured with a non-contact three dimensional optical interference surface roughness analyzer (commercially available from Veeco Instruments, under the trade name of WYKONT1100). Here, an evaluation sample specimen employed here was manufactured by stacking the resin sheet with the copper foil obtained in the operation of 1, and then etching the entire surface of the electrolytic copper foil layer.

(3) Rate of Change of Peel Strength

A rate of change (B/A×100) of a 90-degree peel strength (conducted with peel strength B) for the adhesiveness between the copper foil layer and the insulating resin layer that has been treated with the following treatments (1) to (5) after the carrier layer is delaminated from the copper foil layer (referred to as "peel strength B") over a 90-degree peel strength for the adhesiveness between the copper foil layer and the insulating resin layer that has been treated with only the following treatment (1) after the carrier layer is delaminated from the copper foil layer (referred to as "peel strength A") was calculated.

treatment (1):
the resin sheet with the copper foil was cured at 200 degrees C. for 60 minutes;
treatment (2)
the cured sheet was left for 192 hours within an atmosphere at a temperature of 30 degrees C. and a humidity of 60%;
treatment (3):
after the treatment (2), the sheet was heated at 260 degrees C. to 262 degrees C. for 5 to 10 seconds (passing through a reflow furnace);
treatment (4):
after the treatment (3), the sheet was cooled to 30 degrees C.; and treatment (5):
the treatment (3) and the treatment (4) were additionally repeated for two cycles.

In addition to above, the specific description on the treatment (3) to the treatment (4) may provide a heat flow shown in FIG. 3. After the treatment (2) was finished, the temperature of the copper foil layer and the insulating resin layer was gradually elevated from room temperature (25 degrees C.) to 160 degrees C. (in 50 to 60 seconds). Next, the temperature was also elevated from 160 degrees C. to 200 degrees C. in 50 to 60 seconds. Then, the temperature was also elevated from 200 degrees C. to 260 degrees C. in 65 to 75 seconds, and further the layers were heated at a temperature of 260 to 262 degrees C. for 5 to 10 seconds (reflow). Then, a cooling was carried out to 30 degrees C. for 15 minutes (radiational cooling). Once the treatment (5) was finished, then an electrolytic copper plating was conducted so as to achieve the thickness of the copper foil layer as 25 μm. Then, the 90-degree peel strength between the insulating resin layer and the copper foil layer was measured. On the other hand, 90-degree peel strength for the adhesion between the insulating resin layer processed by the treatment (1) and the copper foil layer was measured as follows. First of all, once the treatment (1) is finished, then an electrolytic copper plating is conducted so as to achieve the thickness of the copper foil layer as 25 μm. Then, the 90-degree peel strength between the insulating resin layer and the copper foil layer was measured.

The results are shown in Tables 2 and 3. Respective marks in the Tables indicate the following conditions:
A: good, equal to or higher than 80% and less than 120%;
B: substantially no problem, equal to or higher than 50% and less than 80%, and equal to or higher than 120% and less than 150%;
C: substantially unusable, equal to or higher than 150%; and
D: unusable, delaminated.

In addition to above, in only Example 1 and Examples 9 and 10 discussed later, the rate of change in the peel strength was measured in the case that the above-described treatment (2) was changed to a treatment, in which the cured sheet was left for 168 hours within an atmosphere at a temperature of 85 degrees C. and a humidity of 85% (other treatments were the same as described above). The results are shown in Table 3. The marks are the same as that described above for the rate of change in the peel strength.

(4) Processibility for Microinterconnect

Presences of a short-circuit and a disconnection in an outer layer circuit pattern were observed with a metallurgical microscope, and were judged by a continuity test. Besides, a geometry of the interconnect was observed by the cross section to conduct an evaluation. In addition to above, two types of evaluation sample specimens, namely one having a pattern of L/S=20/20 μm in the laser processing and the outer layer circuit, and one having a pattern of L/S=10/10 μm, were employed. Respective marks indicate the following conditions:
A: good, no short circuit, no disconnection and no delamination, the circuit geometry is normal;
B: substantially no problem, no short circuit, no disconnection and no delamination, but the circuit geometry is slightly abnormal;
C: substantially unusable, any one of short circuit, disconnection and delamination was occurred, the circuit geometry is abnormal; and
D: unusable, it includes short circuit, disconnection and delamination.

(5) Inter-Line Insulating Reliability

A test for the inter-line insulating reliability was conducted in the conditions of an applied voltage of 5 V DC, a temperature of 130 degrees C., and with a humidity of 85%. In addition to above, a multilayer printed wiring board having a resin sheet further stacked on the substrate, which was manufactured to have the above-described L/S=20/20 μm pattern, was employed for an evaluation sample specimen.

The test was finished when the insulation resistance was lower than $1 \times 10^8 \Omega$.
Respective marks indicate the following conditions:
A: good, equal to or longer than for 500 hours;
B: substantially no problem, equal to or longer than for 200 hours and less than 500 hours;
C: substantially unusable, equal to or longer than for 100 hours and less than 200 hours; and
D: unusable, less than 100 hours.

Next, the semiconductor device manufactured by using the multilayer printed wiring board obtained in the above-described operation 3. will be described.

The above-described multilayer printed wiring board having the electrode sections for coupling, which are subjected to nickel-gold plating treatment and are arranged corresponding to the solder bump arrangement of the semiconductor element, was cut into a piece of 50 mm×50 mm and the piece was employed. A semiconductor element (test element group (TEG) semiconductor element, size 15 mm×15 mm, thickness 0.8 mm) includes a solder bump formed of eutectic crystal of tin/lead (Sn/Pb) composition, and a circuit protection film formed of a positive type photopolymer (commercially available from Sumitomo Bakelite Co. Ltd., under the trade name of CRC-8300). The assembly of the semiconductor device was carried out by, first of all, uniformly coating the solder bump with a flux material by a transfer process, and then conducting an installation on the multilayer printed wiring board via a thermal compression bonding with a flip-chip bonder device. Next, a fused junction of the solder bump was achieved with an infra red (IR) reflow furnace, and then a liquid encapsulating resin (commercially available from Sumitomo Bakelite Co. Ltd., under the trade name of CRP- 4152R) was loaded, and the liquid encapsulating resin was cured to obtain the semiconductor device. In addition to above, the curing condition for the liquid encapsulating resin was a temperature of 150 degrees C. and a time duration of 120 minutes.

Evaluations on the following evaluation items were conducted for the resin sheet with the copper foil, the multilayer printed wiring board, and the semiconductor device, which were obtained by the above-described processes. The results are shown in Table 2.

(6) Packaging Reliability

The packaging reliability was evaluated for the semiconductor device obtained according to the above-described processes based upon J-STD-20 of IPC/JEDEC. In addition to above, the reflow process at 260 degrees C. was conducted for three cycles, and then a delamination of the insulating resin layer, a delamination of the back surface of the semiconductor element, and a defect of the solder bump were evaluated with an ultrasonic flaw detector. Respective marks in the Tables indicate the following conditions:

A: Level 2a pass: good;
B: Level 3 pass: substantially no problem;
C: substantially unusable, delamination in the insulating resin layer and the copper circuit; and
D: unusable, delamination in the insulating resin layer and the copper circuit, a delamination in the back surface of the semiconductor element, and a bump defect.

Example 2

A resin sheet with a copper foil, a multilayer printed wiring board, and a semiconductor device were manufactured similarly as in Example 1, except that 70 parts by weight (40.8% wt.) of a talc (commercially available from Fuji Talc Co. Ltd., under the trade name of LMS-400) was employed for the inorganic filler, and the resin sheet with the copper foil, the multilayer printed wiring board, and the semiconductor device were evaluated, and the results are shown in Table 2.

Example 3

An epoxy resin (commercially available from Nippon Kayaku, EOCN-1020-75) 28.8% wt., and 30 parts by weight (19.2% wt.) of a phenolic novolac cyanate ester as the cyanate ester resin were employed, and 15 parts by weight (9.6% wt.) of 1,1'-bis(4-cyanatophenyl)ethane was employed. Further, 55 parts by weight (35.1% wt.) of an inorganic filler of spherical silica having a mean particle diameter of 0.5 μm (commercially available from Admatechs Company Limited under the trade name of SO-25H) was employed. Further, 6.4% wt. of a phenoxy resin (commercially available from JER under the trade name of YX8100, molecular weight of 30,000) was employed. Other features were the same as employed in Example 1. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 2.

Example 4

26 parts by weight (11.5% wt.) of an epoxy resin (commercially available from Nippon Kayaku under the trade name of EOCN-1020-75); 50 parts by weight (22.1% wt.) of a cyanate ester resin (phenolic novolac cyanate ester, PT30); 125 parts by weight (55.2% wt.) of an inorganic filler of spherical silica having a mean particle diameter of 0.5 μm (commercially available from Admatechs Company Limited under the trade name of SO-25H); 1 part by weight (0.6% wt.) of a polyacrylic ester (commercially available from BYK-Chemie under the trade name of BYK-350); 24 parts by weight (10.6% wt.) of an phenolic resin (commercially available from Meiwa Plastic Industries Ltd., under the trade name of MEH7851-4L), and 0.2% wt. of a cure accelerator (commercially available from Shikoku Chemicals Corporation under the trade name of 1B2PZ), were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 2.

Example 5

50 parts by weight (31.9% wt.) of an epoxy resin of biphenyl aralkyl epoxy resin (commercially available from Nippon Kayaku under the trade name of NC3000); 30 parts by weight (19.2% wt.) of a cyanate ester resin (phenolic novolac cyanate ester, PT30); 55 parts by weight (35.1% wt.) of an inorganic filler of spherical silica having a mean particle diameter of 0.5 μm (commercially available from Admatechs Company Limited under the trade name of SO-25H); 20 parts by weight (12.9% wt.) of a thermoplastic resin of a phenoxy resin (commercially available from JER under the trade name of YX8100, molecular weight of 30,000); 1 part by weight (0.6% wt.) of a polyacrylic ester (commercially available from BYK-Chemie under the trade name of BYK-350); and 0.5 part by weight (0.3% wt.) of a cure accelerator (commercially available from Shikoku Chemicals Corporation under the trade name of 1B2PZ), were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 2.

Example 6

A resin sheet with a copper foil, a multilayer printed wiring board, and a semiconductor device were manufactured similarly as in Example 1, except that a prepreg was manufactured by dipping a fiberglass cloth with the resin varnish of Example 1 and then drying thereof, and laminating thereof between the electrolytic copper foil layer (mat surface) of the copper foil used in Example 1 and the cover film to at a temperature of equal to or higher than the melting point of the prepreg, and evaluations were conducted for the resin sheet with the copper foil, the multilayer printed wiring board, and the semiconductor device, and the results are shown in Table 1.

Example 7

50 parts by weight (29.2% wt.) of an epoxy resin (commercially available from Nippon Kayaku, EOCN-1020-75), 35 parts by weight (20.4% wt.) of a cyanate ester resin (phenolic novolac cyanate ester, PT30), 70 parts by weight (40.8% wt.) of an inorganic filler of a spherical silica having a mean particle diameter of 0.5 μm (commercially available from Admatechs Company Limited, SO-25H), 10 parts by weight (5.8% wt.) of a thermoplastic resin of a phenoxy resin (commercially available from JER, YX8100, molecular weight 30,000), 1 part by weight (0.6% wt.) of a polyacrylic ester (commercially available from BYK-Chemie, BYK-350), 5 parts by weight (2.9% wt.) of a phenolic resin (commercially available from Meiwa Plastic Industries, MEH7851-4L), and 0.5 part by weight (0.3% wt.) of a cure accelerator (commercially available from Shikoku Chemicals Corporation, 1B2PZ) were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 2. In addition to above, the ratio of the inorganic filler in the resin composition was about 41% wt.

Example 8

29.3% wt. of an epoxy resin (commercially available from Nippon Kayaku, EOCN-1020-75), 20.5% wt. of a cyanate ester resin (phenolic novolac cyanate ester, PT30), 41.1% wt. of an inorganic filler of a spherical silica having a mean particle diameter of 0.5 μm (commercially available from Admatechs Company Limited, SO-25H), 5.9% wt. a thermoplastic resin of a phenoxy resin (commercially available from JER, YX8100, molecular weight 30,000), 2.9% wt. of a phenolic resin (commercially available from Meiwa Plastic Industries, MEH7851-4L), and 0.3% wt. of a cure accelerator (commercially available from Shikoku Chemicals Corporation, 1B2PZ) were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 2.

Example 9

17.5% wt. of an epoxy resin (commercially available from Nippon Kayaku, EOCN-1020-75), 35.0% wt. of a cyanate ester resin (phenolic novolac cyanate ester, 30PT), 40.8% wt. of an inorganic filler of a spherical silica having a mean particle diameter of 0.5 μm (commercially available from Admatechs Company Limited, SO-25H), 5.9% wt. of a thermoplastic resin of a phenoxy resin (commercially available from JER, YX8100, molecular weight 30,000), 0.6% wt. of a polyacrylic ester (commercially available from BYK-Chemie, BYK-350) and 0.2% wt. of a cure accelerator (commercially available from Shikoku Chemicals Corporation, 1B2PZ) were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 3.

Example 10

35.0% wt. of an epoxy resin (commercially available from Nippon Kayaku, EOCN-1020-75), 17.2% wt. of a cyanate ester resin (phenolic novolac cyanate ester, PT30), 40.8% wt. of an inorganic filler of a spherical silica having a mean particle diameter of 0.5 μm (commercially available from Admatechs Company Limited, SO-25H), 5.9% wt. of a thermoplastic resin of a phenoxy resin (commercially available from JER, YX8100, molecular weight 30,000), 0.6% wt. of a polyacrylic ester (commercially available from BYK-Chemie, BYK-350), and 0.5% wt. of a cure accelerator (commercially available from Shikoku Chemicals Corporation, 1B2PZ) were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 3.

Example 11

34.2% wt. of an epoxy resin (commercially available from Nippon Kayaku, EOCN-1020-75), 16.8% wt. of a cyanate ester resin (phenolic novolac cyanate ester, PT30), 40.8% wt. of an inorganic filler of a spherical silica having a mean particle diameter of 0.5 μm (commercially available from Admatechs Company Limited, SO-25H), 5.7% wt. of a thermoplastic resin of a phenoxy resin (commercially available from JER, YX8100, molecular weight 30,000), 2.0% wt. of a polyacrylic ester (commercially available from BYK-Chemie, BYK-350), and 0.5% wt. of a cure accelerator (commercially available from Shikoku Chemicals Corporation, 1B2PZ) were mixed and dissolved in methylethyl ketone. Then, a high-speed stirring device was employed to stir thereof for 60 minutes to prepare a resin varnish containing 70% wt. of the solid content. A resin sheet with a copper foil, a multilayer printed wiring board, and a semiconductor device were manufactured similarly as in Example 1, and evaluations were conducted for the resin sheet with the copper foil, the multilayer printed wiring board, and the semiconductor device, and the results are shown in Table 3.

Comparative Example 1

Polyethylene terephthalate was employed for a support of the insulating resin layer, in place of the copper foil composed of the delaminatable carrier layer sticked with the electrolytic copper foil layer having a thickness of 0.5 to 5.0 μm.

Further, 17 parts by weight (9.9% wt.) of an epoxy resin of bis A epoxy resin (commercially available from JER, under the trade name of EPICOTE 828EL), 34 parts by weight (19.8% wt.) of a phenolic novolac epoxy resin (commercially available from DIC Corporation, under the trade name of N865, epoxy equivalent 200 to 215), 70 parts by weight (40.8% wt.) of an inorganic filler of a spherical silica having a mean particle diameter of 0.5 μm (commercially available from Admatechs Company Limited, SO-25H), 39 parts by weight (22.7% wt.) of a curing agent of a modified phenolic novolac (commercially available from DIC Corporation, TD-2090), 10 parts by weight (5.9% wt.) of a thermoplastic resin of a phenoxy resin (commercially available from JER, YX8100, molecular weight 30,000), 1 part by weight (0.6% wt.) of a polyacrylic ester (commercially available from BYK-Chemie, BYK-350), and 0.5 part by weight (0.3% wt.) of a cure accelerator (commercially available from Shikoku Chemicals Corporation, 2E4MZ) were mixed and dissolved in methylethyl ketone, without adding a resin composition of a cyanate ester resin composing the insulating resin layer. Then, a high-speed stirring device was employed to stir thereof for 60 minutes to prepare a resin varnish containing 70% wt. of the solid content. Similarly as in Example 1, a resin sheet was manufactured, and was stacked on an internal layer circuit by employing a vacuum laminator device. Next, the polyethylene terephthalate was delaminated, and an insulating resin layer was formed by heating at a temperature of 180 degrees C. for a duration time of 60 minutes. The subsequent laser processing and the processing for the outer layer circuit were conducted similarly as in Example 1. Evaluations were conducted for the resin sheet with the copper foil, the multilayer printed wiring board, and the semiconductor device, and the results are shown in Table 2.

Comparative Example 2

A resin composition comprising an insulating resin layer was manufactured as follows. 26.2% wt. of an epoxy resin of phenolic novolac epoxy resin (commercially available from DIC Corporation, N865), 26.2% wt. of 2,2-bis(4-cyanato phenyl) propane (commercially available from Lonza Japan, BA230), 40.8% wt. of an inorganic filler of a spherical silica having a mean particle diameter of 0.5 μm (commercially available from Admatechs Company Limited, SO-25H), 5.9% wt. of a thermoplastic resin of a phenoxy resin (commercially available from JER, YX8100, molecular weight 30,000), 0.6% wt. of a polyacrylic ester (commercially available from BYK-Chemie, BYK-350), and 0.3% wt. of a cure accelerator (commercially available from Shikoku Chemicals Corporation, 2E4MZ) were mixed and dissolved in methylethyl ketone. Then, a high-speed stirring device was employed to stir thereof for 60 minutes to prepare a resin varnish containing 70% wt. of the solid content. Similarly as in Example 1, a resin sheet was manufactured, and was stacked on an internal layer circuit by employing a vacuum laminator device. Next, the polyethylene terephthalate was delaminated, and an insulating resin layer was formed by heating at a temperature of 180 degrees C. for a duration time of 60 minutes. The subsequent laser processing and the processing for the outer layer circuit were conducted similarly as in Example 1. Evaluations were conducted for the resin sheet with the copper foil, the multilayer printed wiring board, and the semiconductor device, and the results are shown in Table 2.

Comparative Example 3

An insulating resin layer was manufactured as follows. 26.2% wt. of an epoxy resin of a his A epoxy resin (commercially available from JER, EPICOTE 828 EL), 26.2% wt. of 1,1-bis(4-cyanato phenyl)ethane (commercially available from Lonza Japan, LECY), 40.8% wt. of an inorganic filler of a spherical silica having a mean particle diameter of 0.5 μm (commercially available from Admatechs Company Limited, SO-25H), 5.9% wt. of a thermoplastic resin of a phenoxy resin (commercially available from JER, YX8100, molecular weight 30,000), 0.6% wt. of polyacrylic ester (commercially available from BYK-Chemie, BYK-350), and 0.3% wt. of a cure accelerator (commercially available from Shikoku Chemicals Corporation, 2E4MZ) was mixed and dissolved in methylethyl ketone. Then, a high-speed stirring device was employed to stir thereof for 60 minutes to prepare a resin varnish containing 70% wt. of the solid content. Similarly as in Example 1, a resin sheet was manufactured, and was stacked on an internal layer circuit by employing a vacuum laminator device. Next, the polyethylene terephthalate was delaminated, and an insulating resin layer was formed by heating at a temperature of 180 degrees C. for a duration time of 60 minutes. The subsequent laser processing and the processing for the outer layer circuit were conducted similarly as in Example 1. Evaluations were conducted for the resin sheet with the copper foil, the multilayer printed wiring board, and the semiconductor device, and the results are shown in Table 2.

The results of the evaluations for the resin sheets with the copper foils, the multilayer printed wiring boards and the semiconductor devices in Examples 1 to 8 and Comparative Example 1 to 3 are shown in Table 2. Further, the results of the evaluations for the resin sheets with the copper foils, the multilayer printed wiring boards and the semiconductor devices in Examples 1, 9, 10 and 11 are shown in Table 3. In addition to above, the compositions of the insulating resin layers in the respective Examples and Comparative Examples are shown in Table 1. The unit employed in Table 1 is % wt.

TABLE 1

| | | | EXAMPLES | | | | |
|---|---|---|---|---|---|---|---|
| | | | EXAMPLE 1 | EXAMPLE 2 | EXAMPLE 3 | EXAMPLE 4 | EXAMPLE 5 |
| EPOXY | NIPPON KAYAKU, "EOCN-1020-75" | NOVOLAC EPOXY | 26.2 | 26.2 | 28.8 | 11.5 | |
| | BIPHENYL DIMETHYLENE (NIPPON KAYAKU, "NC3000", EPOXY EQUIVALENT 275 g/eq.) | BIPHENYL ARALKYL | | | | | 31.9 |
| PHENOL | MEH7851-4L, MEIWA PLASTIC INDUSTRIES, HYDROXYL EQUIVALENT 187 | BIPHENYL ARALKYL | | | | 10.6 | |
| CYANATE | PHENOLIC NOVOLAC CYANATE ESTER, | NOVOLAC CYANATE | 26.2 | 26.2 | 19.2 | 22.1 | 19.2 |

TABLE 1-continued

|  |  |  |  |  |  |  |  |
|---|---|---|---|---|---|---|---|
| | LONZA JAPAN, "PT-30" 1,1'-BIS(4-CYANATO PHENYL)ETHANE | BIS E CYANATE | | | | 9.6 | |
| INORGANIC FILLER | MEAN PARTICLE DIAMETER 0.5 μm, ADMATECHS COMPANY, "SO-25H" | SILICA | 40.8 | | 35.1 | 55.2 | 35.1 |
| | FUJI TALC, "LMS-400" | TALC | | 40.8 | | | |
| PHENOXY | JER, "YX8100" | BIPHENYL/BIS S | 5.9 | 5.9 | 6.4 | | 12.9 |
| ADDITIVES | BYK-Chemie, "BYK-350" | POLYACRYLIC ESTER | 0.6 | 0.6 | 0.6 | 0.4 | 0.6 |
| | CURE ACCELERATOR: IMIDAZOLE COMPOUND (SHIKOKU CHEMICALS, "CUREZOL 1B2PZ") | 1B2PZ | 0.3 | 0.3 | 0.3 | 0.2 | 0.3 |
| | | | 100.0 | 100.0 | 100.0 | 100.0 | 100.0 |

| | | | EXAMPLE 6 | EXAMPLE 7 | EXAMPLE 8 | EXAMPLE 9 | EXAMPLE 10 | EXAMPLE 11 |
|---|---|---|---|---|---|---|---|---|
| EPOXY | NIPPON KAYAKU, "EOCN-1020-75" BIPHENYL DIMETHYLENE (NIPPON KAYAKU, "NC3000", EPOXY EQUIVALENT 275 g/eq.) | NOVOLAC EPOXY BIPHENYL ARALKYL | 26.2 | 29.2 | 29.3 | 17.5 | 35.0 | 34.2 |
| PHENOL | MEH7851-4L, MEIWA PLASTIC INDUSTRIES, HYDROXYL EQUIVALENT 187 | BIPHENYL ARALKYL | | 2.9 | 2.9 | | | |
| CYANATE | PHENOLIC NOVOLAC CYANATE ESTER, LONZA JAPAN, "PT-30" 1,1'-BIS(4-CYANATO PHENYL)ETHANE | NOVOLAC CYANATE BIS E CYANATE | 26.2 | 20.4 | 20.5 | 35.0 | 17.2 | 16.8 |
| INORGANIC FILLER | MEAN PARTICLE DIAMETER 0.5 μm, ADMATECHS COMPANY, "SO-25H" | SILICA | 40.8 | 40.8 | 41.1 | 40.8 | 40.8 | 40.8 |
| | FUJI TALC, "LMS-400" | TALC | | | | | | |
| PHENOXY | JER, "YX8100" | BIPHENYL/BIS S | 5.9 | 5.8 | 5.9 | 5.9 | 5.9 | 5.7 |
| ADDITIVES | BYK-Chemie, "BYK-350" | POLYACRYLIC ESTER | 0.6 | 0.6 | | 0.6 | 0.6 | 2.0 |
| | CURE ACCELERATOR: IMIDAZOLE COMPOUND (SHIKOKU CHEMICALS, "CUREZOL 1B2PZ") | 1B2PZ | 0.3 | 0.3 | 0.3 | 0.2 | 0.5 | 0.5 |
| | | | 100.0 | 100.0 | 100.0 | 100.0 | 100.0 | 100.0 |

COMPARATIVE EXAMPLES

| | | | COMPARATIVE EXAMPLE 1 | COMPARATIVE EXAMPLE 2 | COMPARATIVE EXAMPLE 3 |
|---|---|---|---|---|---|
| EPOXY | NIPPON KAYAKU, "EOCN-1020-75" | NOVOLAC EPOXY | | | |
| | BIS A (JAPAN EPOXY RESIN, "JER828EL", EPOXY EQUIVALENT 190 g/eq.) | BIS A LIQUID | 9.90 | | 26.20 |

TABLE 1-continued

|  |  |  |  |  |  |
|---|---|---|---|---|---|
|  | DIC, "N865" | PHENOLIC NOVOLAC | 19.80 | 26.20 |  |
| PHENOL | DIC, "TD-2090", HYDROXYL EQUIVALENT 105 | PHENOLIC NOVOLAC | 22.70 |  |  |
| CYANATE | PHENOLIC NOVOLAC CYANATE ESTER, LONZA JAPAN, "PT-30" | NOVOLAC CYANATE |  |  |  |
|  | 2,2-BIS(4-CYANATOPHENYL)PROPANE | BIS A CYANATE |  | 26.20 |  |
|  | 1,1'-BIS(4-CYANATO PHENYL)ETHANE | BIS E CYANATE |  |  | 26.20 |
| INORGANIC FILLER | MEAN PARTICLE DIAMETER 0.5 μm, ADMATECHS COMPANY, "SO-25H" | SILICA | 40.80 | 40.80 | 40.80 |
| PHENOXY | JER, "YX8100" | BIPHENYL/ BIS S | 5.90 | 5.90 | 5.90 |
| ADDITIVES | BYK-Chemie, "BYK-350" | POLYACRYLIC ESTER | 0.60 | 0.60 | 0.60 |
|  | CURE ACCELERATOR: IMIDAZOLE COMPOUND (SHIKOKU CHEMICALS, "CUREZOL 1B2PZ") | 1B2PZ |  |  |  |
|  | CURE ACCELERATOR: IMIDAZOLE COMPOUND (SHIKOKU CHEMICALS, "CUREZOL 2E4MZ") | 2E4MZ | 0.30 | 0.30 | 0.30 |
|  |  |  | 100.00 | 100.00 | 100.00 |

TABLE 2

|  | EXAMPLE 1 | EXAMPLE 2 | EXAMPLE 3 | EXAMPLE 4 | EXAMPLE 5 | EXAMPLE 6 |
|---|---|---|---|---|---|---|
| (1) THERMAL EXPANSION COEFFICIENT (ppm/degree C.) | 31 | 33 | 36 | 23 | 38 | 18 |
| (2) SURFACE ROUGHNESS (Ra) (μm) | 0.41 | 0.39 | 0.40 | 0.41 | 0.39 | 0.42 |
| (3) CHANGE RATE OF PEEL STRENGTH[1] | A | B | B | A | A | B |
| (4) PROCESSIBILITY FOR MICROINTERCONNECT (LS = 20/20) | A | B | B | A | A | B |
| (4) PROCESSIBILITY FOR MICROINTERCONNECT (LS = 10/10) | A | B | B | A | A | B |
| (5) INTER-LINE INSULATING RELIABILITY | B | B | A | B | A | B |
| (6) PACKAGING RELIABILITY | A | B | B | A | B | A |

|  | EXAMPLE 7 | EXAMPLE 8 | COMPARATIVE EXAMPLE 1 | COMPARATIVE EXAMPLE 2 | COMPARATIVE EXAMPLE 3 |
|---|---|---|---|---|---|
| (1) THERMAL EXPANSION COEFFICIENT (ppm/degree C.) | 30 | 31 | 47 | 39 | 43 |
| (2) SURFACE ROUGHNESS (Ra) (μm) | 0.38 | 0.51 | 0.62 | 0.39 | 0.41 |
| (3) CHANGE RATE OF PEEL STRENGTH[1] | B | A | C | D | D |
| (4) PROCESSIBILITY FOR MICROINTERCONNECT (LS = 20/20) | B | B | B | D | D |
| (4) PROCESSIBILITY FOR MICROINTERCONNECT (LS = 10/10) | B | C | C | D | D |
| (5) INTER-LINE INSULATING RELIABILITY | A | B | D | D | D |
| (6) PACKAGING RELIABILITY | A | A | D | D | D |

[1] STRAIGHT THREE CYCLES OF 260 DEGREE C. REFLOW WERE CONDUCTED AFTER TREATMENT AT TEMPERATURE OF 30 DEGREE C. AND HUMIDITY 60% FOR 192 HOURS.

TABLE 3

|  | EXAMPLE 1 | EXAMPLE 9 | EXAMPLE 10 | EXAMPLE 11 |
|---|---|---|---|---|
| (1) THERMAL EXPANSION COEFFICIENT (ppm/degree C.) | 31 | 31 | 38 | 38 |
| (2) SURFACE ROUGHNESS (Ra) (μm) | 0.41 | 0.47 | 0.35 | 0.34 |
| (3) CHANGE RATE OF PEEL STRENGTH[1] | A | B | A | A |
| (3') CHANGE RATE OF PEEL STRENGTH[2] | B | D | D | D |
| (4) PROCESSIBILITY FOR MICROINTERCONNECT (LS = 20/20) | A | B | B | B |
| (4) PROCESSIBILITY FOR MICROINTERCONNECT (LS = 10/10) | A | B | B | B |

TABLE 3-continued

|  | EXAMPLE 1 | EXAMPLE 9 | EXAMPLE 10 | EXAMPLE 11 |
|---|---|---|---|---|
| (5) INTER-LINE INSULATING RELIABILITY | B | B | B | B |
| (6) PACKAGING RELIABILITY | A | B | B | B |

[1]STRAIGHT THREE CYCLES OF 260 DEGREE C. REFLOW WERE CONDUCTED AFTER TREATMENT AT TEMPERATURE OF 30 DEGREE C. AND HUMIDITY 60% FOR 192 HOURS.
[2]STRAIGHT THREE CYCLES OF 260 DEGREE C. REFLOW WERE CONDUCTED AFTER TREATMENT AT TEMPERATURE OF 85 DEGREE C. AND HUMIDITY 85% FOR 168 HOURS.

As can be seen from Tables 2 and 3, Examples 1 to 11 provided improved thermal expansion coefficient of the insulating resin layer of the resin sheet with the copper foil of equal to or lower than 40 ppm/degree C. As a result, the resin sheet with the copper foil exhibits improved packaging reliability. Further, Examples 1 to 11 exhibited smaller rate of change in the peel strength. It is considered that improved inter-line insulating reliability and improved packaging reliability are due to such smaller rate of change in the peel strength. Further, enhanced processability for microinterconnect was achieved in each of the cases of LS=20/20 in Examples 1 to 10. Therefore, theses configurations can be preferably adopted for semiconductor devices with lower profile and high density assembly, which require enhanced inter-line insulating reliability. Further, enhanced processability for microinterconnect was achieved in each of the cases of LS=10/10 in Examples 1 to 7 and Examples 9, 10 and 11. Poor processability for microinterconnect was obtained in each of the case of LS=10/10 in Example 8. A surface roughness Rz (ten point-average roughness) of the surface of the resin layer immediately after forming the insulating resin layer was measured, and Rz was 11.1 μm. On the contrary, a surface roughness Rz (ten point-average roughness) of the surface of the resin layer immediately after forming the insulating resin layer in Example 1 was 3.38 μm. In addition to above, it is found that the content of the polyacrylic ester is preferably equal to or lower than 10.0% wt. of the resin composition exclusive of the filler. Further, it is also found according to Examples 4 and 7 that even the use of phenol as a curing agent allows maintaining desired characteristics and accelerated cure rate.

Comparative Examples 1 to 3 resulted in deteriorated high frequency characteristics due to larger surface roughness of the insulating resin layer, reduced inter-line insulating reliability due to larger rate of change in the peel strength, and reduced packaging reliability due to larger thermal expansion coefficient.

The invention claimed is:
1. A resin sheet with a copper foil, comprising:
a carrier layer;
a copper foil layer having a thickness 0.5 to 5 μm provided over said carrier layer; and
an insulating resin layer formed over said copper foil layer, wherein upon abutting said insulating resin layer to a base material, said carrier layer is delaminated from said copper foil layer, and
wherein said insulating resin layer contains a cyanate ester resin having phenolic novolac backbone and a polyfunctional epoxy resin.
2. The resin sheet with the copper foil as set forth in claim 1, wherein said insulating resin layer contains a polyacrylic ester.
3. The resin sheet with the copper foil as set forth in claim 2, wherein said polyacrylic ester is a polymer of (meth) acrylic ester.
4. The resin sheet with the copper foil as set forth in claim 3, wherein said (meth) acrylic ester is an alkyl ester of (meth) acrylic acid.
5. The resin sheet with the copper foil as set forth in claim 1, wherein said insulating resin layer contains an inorganic filler, and wherein said inorganic filler is a spherical silica having a mean particle diameter D50 of equal to or larger than 0.3 μm and equal to or smaller than 2.0 μm.
6. The resin sheet with the copper foil as set forth in claim 1, wherein a rate of change in peel strength is equal to or higher than 50% and equal to or lower than 150%, said rate of change being presented as (B/A×100(%)),
wherein A is a peel strength A between said insulating resin layer and said copper foil layer after a treatment (1), and B is a peel strength B between said insulating resin layer and said copper foil layer after treatments (1) to (5), and
wherein the treatments (1) to (5) are:
treatment (1):
the resin sheet with the copper foil is cured at 200 degrees C. for 60 minutes;
treatment (2):
the cured sheet is left for 192 hours within an atmosphere at a temperature of 30 degrees C. and a humidity of 60%;
treatment (3):
after the treatment (2), the sheet is heated at 260 degrees C. to 262 degrees C. for 5 to 10 seconds;
treatment (4):
after the treatment (3), the sheet is cooled to 30 degrees C.; and
treatment (5):
the treatment (3) and the treatment (4) are additionally repeated for two cycles.
7. The resin sheet with the copper foil as set forth in claim 1, wherein said insulating resin layer, after a thermal processing at 200 degrees C. for 60 minutes, exhibits an average thermal expansion rate expanding toward a direction along the surface of the insulation resin layer at temperatures ranging from 25 degrees C. to 150 degrees C. of 40 ppm/degree C.
8. The resin sheet with the copper foil as set forth in claim 1, wherein said insulating resin layer contains a phenolic resin.
9. The resin sheet with the copper foil as set forth claim 1, wherein said insulating resin layer further contains a thermoplastic resin.
10. The resin sheet with the copper foil as set forth in claim 9, wherein said thermoplastic resin is a phenoxy resin having biphenyl backbone and having a molecular weight of equal to or higher than $5 \times 10^3$ and equal to or lower than $2.5 \times 10^5$.
11. The resin sheet with the copper foil as set forth claim 1, wherein said insulating resin layer contains a fiberglass cloth.
12. A method for manufacturing a multilayer printed wiring board employing the resin sheet with the copper foil as set forth claim 1, comprising:
stacking said resin sheet with the copper foil over said base material so that said insulating resin layer of said resin sheet with the copper foil is abutted with the surface of the base material having a circuit pattern formed thereon;

delaminating said carrier layer from said resin sheet with the copper foil; and creating a hole in said copper foil layer and said insulating resin layer with a laser beam.

13. The method for manufacturing the multilayer printed wiring board as set forth in claim 12, wherein a rough treatment for said copper foil layer is conducted after said delaminating said carrier layer from said resin sheet with the copper foil, and then said creating said hole is conducted.

14. A printed board, manufactured by the method for manufacturing the multilayer printed wiring board as set forth in claim 12.

15. A semiconductor device, formed by installing a semiconductor element in the printed board as set forth in claim 14.

* * * * *